United States Patent
Eom

(10) Patent No.: US 10,985,112 B2
(45) Date of Patent: Apr. 20, 2021

(54) MEMORY DEVICE AND METHOD FOR FABRICATING THE MEMORY DEVICE

(71) Applicant: SK hynix Inc., Icheon-si (KR)

(72) Inventor: Dae-Sung Eom, Cheongju-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 16/459,796

(22) Filed: Jul. 2, 2019

(65) Prior Publication Data

US 2020/0152585 A1 May 14, 2020

(30) Foreign Application Priority Data

Nov. 9, 2018 (KR) .................. 10-2018-0137423

(51) Int. Cl.
  H01L 23/00 (2006.01)
  H01L 27/11556 (2017.01)
  H01L 27/11524 (2017.01)
  H01L 27/1157 (2017.01)
  H01L 21/768 (2006.01)
  H01L 23/535 (2006.01)
  H01L 23/528 (2006.01)
  H01L 27/11582 (2017.01)

(52) U.S. Cl.
  CPC ...... H01L 23/562 (2013.01); H01L 21/76805 (2013.01); H01L 21/76895 (2013.01); H01L 23/5283 (2013.01); H01L 23/535 (2013.01); H01L 27/1157 (2013.01); H01L 27/11524 (2013.01); H01L 27/11556 (2013.01); H01L 27/11582 (2013.01)

(58) Field of Classification Search
  CPC ......... H01L 21/76805; H01L 21/76595; H01L 27/11524; H01L 23/562; H01L 23/5283; H01L 23/535; H01L 27/11556; H01L 27/1157; H01L 21/76895; H01L 27/11582; H01L 27/11575; H01L 27/11548
  USPC ........................................... 257/14
  See application file for complete search history.

(56) References Cited

U.S. PATENT DOCUMENTS

| | | | |
|---|---|---|---|
| 8,541,831 B2 | 9/2013 | Chae et al. | |
| 8,809,938 B2 * | 8/2014 | Hwang | H01L 27/11582 257/324 |
| 9,754,963 B1 * | 9/2017 | Kawamura | H01L 27/11556 |
| 9,853,038 B1 | 12/2017 | Cui | |
| 9,881,929 B1 | 1/2018 | Ravikirthi et al. | |
| 2018/0350831 A1 * | 12/2018 | Kim | G11C 7/14 |
| 2020/0098771 A1 * | 3/2020 | Nishikawa | H01L 27/11556 |
| 2020/0185405 A1 * | 6/2020 | Cui | H01L 29/0847 |

* cited by examiner

Primary Examiner — Stephen W Smoot
Assistant Examiner — Sun Mi Kim King
(74) Attorney, Agent, or Firm — William Park & Associates Ltd.

(57) ABSTRACT

A vertical memory device includes: a substrate including a memory cell region and a contact region; a plurality of gate electrodes that extend from the memory cell region to the contact region and include pad portions which are end portions stacked in a step shape in the contact region; a plurality of contact plugs coupled to the pad portions of the gate electrodes; and a plurality of supporters formed below the pad portions of the gate electrodes.

20 Claims, 21 Drawing Sheets

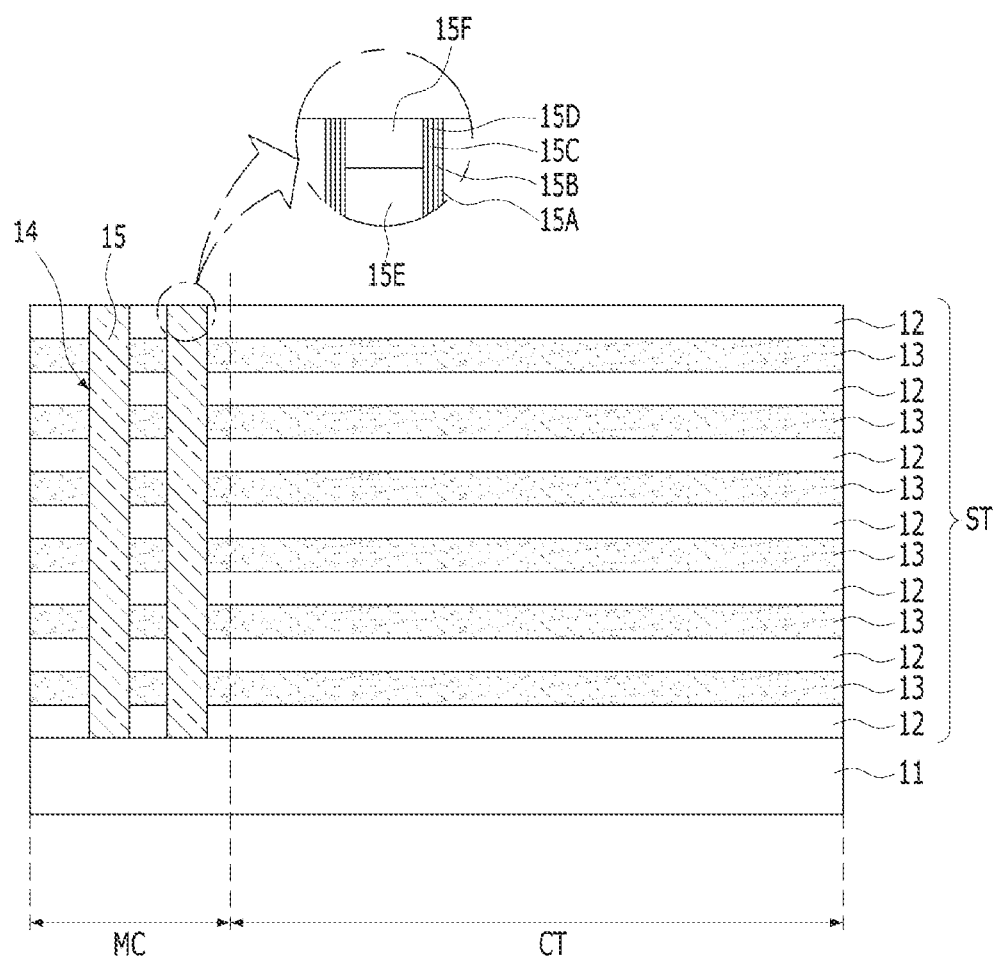

MEMORY DEVICE AND METHOD FOR FABRICATING THE MEMORY DEVICE

CROSS-REFERENCE TO RELATED APPLICATIONS

The present application claims priority of Korean Patent Application No. 10-2018-0137423, filed on Nov. 9, 2018, which is incorporated herein by reference in its entirety.

BACKGROUND

1. Technical Field

Various embodiments generally relate to a semiconductor device, and more particularly, to a vertical semiconductor device and a method for fabricating the vertical semiconductor device.

2. Related Art

Recently, memory devices having a three-dimensional structure are being developed due to an increase in the integration degree of memory devices. A three-dimensional memory device may include memory cells that are vertically stacked over a substrate. Due to the increase in the capacity of a memory device, the difficulty in the process of fabricating a memory device is gradually increasing.

SUMMARY

In accordance with an embodiment, a vertical memory device includes: a substrate including a memory cell region and a contact region; a plurality of gate electrodes that extend from the memory cell region to the contact region and include pad portions which are end portions stacked in a step shape in the contact region; a plurality of contact plugs coupled to the pad portions of the gate electrodes; and a plurality of supporters formed below the pad portions of the gate electrodes.

In accordance with an embodiment, a method for fabricating a vertical memory device includes: forming an alternating stack where dielectric layers and sacrificial layers are alternately stacked over a substrate; forming a step structure in a portion of the alternating stack; forming a plurality of sacrificial pads that cover the step structure and are coupled to the sacrificial layers, respectively; replacing the sacrificial layers and the sacrificial pads with gate electrodes and pad portions, respectively; forming a plurality of contact plugs that are coupled to the pad portions, respectively; and forming two or more supporters below each of the pad portions, respectively. At least one supporter among the two or more supporters is formed to vertically overlap with the contact plug coupled to the respective pad portion, and the other supporters among the two or more supporters are formed not to overlap with the contact plug coupled to the respective pad portion. At least one of the two or more supporters for each of the pluralities of two or more supporters below the pad portions, respectively, include at least one supporter that vertically overlaps with a contact plug for the respective pad portion, and at least one supporter that does not overlap with the contact plug for the respective pad portion. The forming of the step structure in the portion of the alternating stack includes forming a supporter-embedded step structure by penetrating the supporters through the alternating stack. The forming of the supporter-embedded step structure includes forming a plurality of openings by etching a portion of the alternating stack; forming a plurality of preliminary supporters that fill the openings, respectively; and etching the portion of the alternating stack where the preliminary supporters are formed in a form of steps. The supporters include a dielectric material having an etch selectivity with respect to the sacrificial layers.

In accordance with an embodiment, a method for fabricating a vertical memory device includes: forming an alternating stack where dielectric layers and sacrificial layers are alternately stacked over a substrate where a memory cell region and a contact region are defined; forming a step structure embedded with a plurality of pairs of supporters in the alternating stack of the contact region; forming a plurality of sacrificial pads that cover the pairs of supporters and are coupled to the sacrificial layers of the memory cell region, respectively; replacing the sacrificial layers of the memory cell region with gate electrodes, respectively; replacing the sacrificial pads of the contact region with pad portions, respectively; and forming a plurality of contact plugs that are coupled to the pad portions, respectively, wherein the pairs of supporters are positioned below the pad portions, respectively. At least one supporter from each of the pairs of supporters is formed to vertically overlap with a contact plug, from the plurality of contact plugs, coupled to a pad portion, from the plurality of pad portions, coupled to the supporter, and the other supporter from each of the pairs of supporters is formed not to vertically overlap with the contact plug, from the plurality of contact plugs. The forming of the step structure embedded with the plurality of the pairs of supporters in the alternating stack of the contact region includes forming a plurality of openings by etching the alternating stack of the contact region; forming a plurality of preliminary supporters that fill the openings, respectively; and etching the alternating stack where the preliminary supporters are formed in a form of steps. The supporters include a dielectric material.

In accordance with an embodiment, a vertical memory device includes: a substrate including a first region and a second region; a plurality of horizontal dielectric layers and a plurality of horizontal conductive layers that extend from the first region to the second region and have end portions stacked in a step shape in the second region; a plurality of vertical conductive layers that are coupled to the end portions of the horizontal conductive layers; and at least a pair of dielectric supporters that are formed below each of the end portions of the horizontal conductive layers and penetrate through the horizontal dielectric layers.

BRIEF DESCRIPTION OF THE DRAWINGS

FIGS. 4A to 4K are cross-sectional views illustrating a method for fabricating a vertical memory device in accordance with an embodiment.

DETAILED DESCRIPTION

Figure 1A:
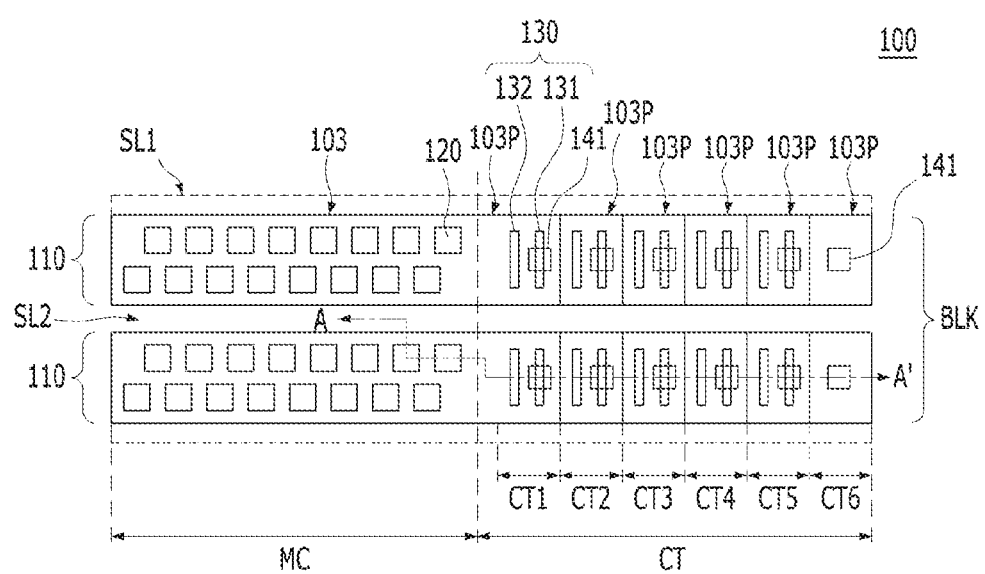
FIG. 1A is a plan view illustrating a vertical memory device in accordance with an embodiment.

Examples of embodiments will be described below with reference to the accompanying drawings. The embodiments may, however, be embodied in different forms and should not be construed as limited to the embodiments set forth herein. Rather, these embodiments are provided so that this disclosure will be thorough and complete, and will fully convey the scope to those skilled in the art. Throughout the disclosure, like reference numerals refer to like parts throughout the various figures and embodiments.

The drawings are not necessarily to scale and in some instances, proportions may have been exaggerated in order to clearly illustrate features of the embodiments. When a first layer is referred to as being "on" a second layer or "on" a substrate, it not only refers to a case where the first layer is formed directly on the second layer or the substrate but also a case where a third layer exists between the first layer and the second layer or the substrate.

Embodiments of the present invention are directed to a vertical semiconductor device having excellent electrical characteristics and high integration degree, and a method for fabricating the vertical semiconductor device.

Figure 1B:
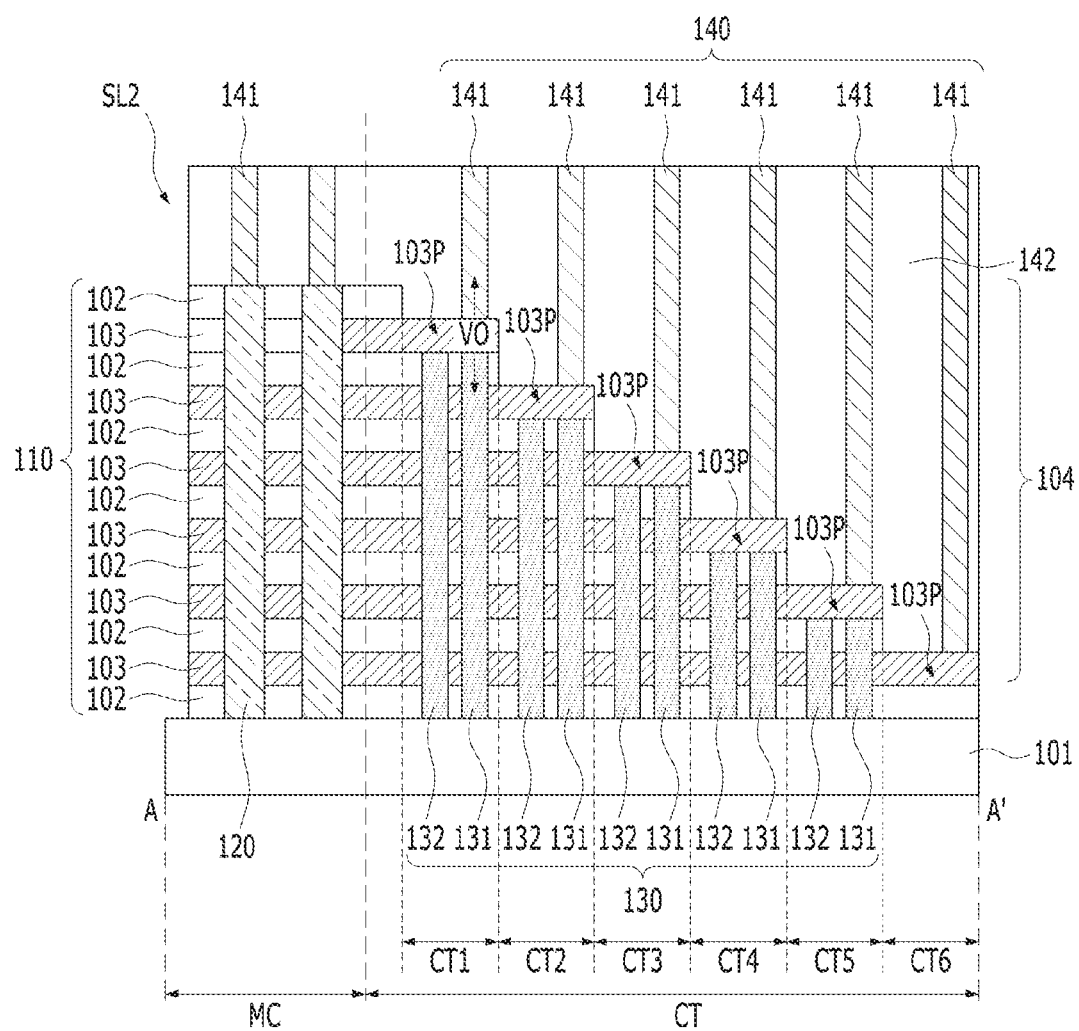
FIG. 1B is a cross-sectional view of the vertical memory device taken along a line A-A' illustrated in FIG. 1A.

FIG. 1A is a plan view illustrating a vertical memory device in accordance with an embodiment. FIG. 1B is a cross-sectional view of the vertical memory device taken along a line A-A' illustrated in FIG. 1A.

Referring to FIGS. 1A and 1B, a vertical memory device 100 may be divided into blocks BLK by a first slit SL1, and one block BLK may include a plurality of stacked structures 110. The neighboring stacked structures 110 may be separated by a second slit SL2. The first slit SL1 and the second slit SL2 may be filled with a dielectric material (not shown).

The vertical memory device 100 may include a substrate 101 including a memory cell region MC and a contact region CT, a stacked structure 110 over the substrate 101, a plurality of vertical channel structures 120 penetrating through the stacked structure 110 of the memory cell region MC, a plurality of support structures 130 penetrating through the stacked structure 110 of the contact region CT, and a plug structure 140 positioned in an upper portion of the support structure 130.

The contact region CT may include a plurality of contact regions CT1 to CT6. The contact regions CT1 to CT6 may have a step shape.

The substrate 101 may include a semiconductor substrate. The substrate 101 may be formed of a material containing silicon. The substrate 101 may include silicon, monocrystalline silicon, polysilicon, amorphous silicon, silicon germanium, monocrystalline silicon germanium, polycrystalline silicon germanium, carbon-doped silicon, a combination thereof, or a multi-layer thereof. The substrate 101 may include other semiconductor materials, such as germanium. The substrate 101 may include a III/V-group semiconductor substrate, for example, a compound semiconductor substrate such as GaAs. The substrate 101 may include an SOI (Silicon-On-Insulator) substrate.

The stacked structure 110 may include a plurality of dielectric layers 102 and a plurality of gate electrodes 103. The stacked structure 110 may be formed by alternately stacking a plurality of dielectric layers 102 and a plurality of gate electrodes 103. The uppermost layer of the stacked structure 110 may be a dielectric layer 102. The dielectric layer 102 in the lowermost layer among the dielectric layers 102 may contact the substrate 101. The gate electrodes 103 may extend from the memory cell region MC to the contact region CT, and pad portions 103P, which are end portions 103P in the contact region CT, may be stacked to have a step shape 104.

The gate electrode 103 may include silicon, metal, a metal nitride, a metal silicide, or a combination thereof. The gate electrode 103 may be formed by Chemical Vapor Deposition (CVD) or Atomic Layer Deposition (ALD). The gate electrode 103 may include a tungsten-containing material. The gate electrode 103 may include a tungsten layer. The tungsten layer may be deposited by using $WF_6$ as a tungsten source material and using at least one among $H_2$, $SiH_4$, and $B_2H_6$ as a reducing gas. According to other embodiments, the tungsten layer may be deposited by using a fluorine-free tungsten source, such as $W(CO)_6$.

The support structure 130 may be formed in the contact region CT. The support structure 130 may include a plurality of supporters 131 and 132. The supporters 131 and 132 may be formed in each of a plurality of contact regions CT1 to CT6. Each of the supporters 131 and 132 may include at least one pair of dielectric supporters. In an embodiment, each of the supporters 131 and 132 may include a dielectric material. The supporters 131 and 132 may include a first supporter 131 and a second supporter 132. The first supporter 131 may vertically overlap with a contact plug 141 (refer to a reference symbol 'VO'). The second supporter 132 may be spaced apart from the first supporter 131 and might not vertically overlap with the contact plug 141. According to other embodiments, the first supporter 131 might not vertically overlap with the contact plug 141. According to other embodiments, the first supporter 131 may be spaced apart from the second supporter 132 and might not vertically overlap with the contact plug 141 and the second supporter (though not illustrated) may overlap with the contact plug 141.

The supporters 131 and 132 may have a shape extending vertically to the surface of the substrate 101. The upper surfaces of the supporters 131 and 132 may have different levels in a direction substantially perpendicular to the surface of the substrate 101. In an embodiment, the upper surfaces of the supporters 131 and 132 may have different heights from the surface of the substrate 101. In some embodiments the upper surfaces of the supporters 131 and 132 for a first contact region may have different heights from the surface to the substrate to the pad portion 103P. In other embodiments, the upper surfaces of the supporters 131 and 132 for a first contact region (i.e., CT1) may have a different height from the surface to the substrate to the pad portion 103P than the height of upper surfaces of the supporters 131 and 132 for a second contact region (i.e., CT2) have from the surface of the substrate to the pad portion 103P for that second contact region. The bottom surfaces of the supporters 131 and 132 may contact the surface of the substrate 101. In an embodiment, the bottom surfaces of each of the supporters 131 and 132 may contact the surface of the substrate 101 at different locations of the surface of the substrate. Referring to FIG. 1A, the cross-sectional shape of the supporters 131 and 132 may be substantially rectangular. The cross-sectional shape of the supporters 131 and 132 may include a closed curved shape, such as circular shape or an elliptical shape, etc. The cross-sectional shape of the supporters 131 and 132 may include a circle, an ellipse, or a polygon, etc., in addition to the rectangle, or a combination thereof. The cross-sectional area of the supporters 131 and 132 may be greater than the cross-sectional area of the contact plugs 141. The supporters 131 and 132 may not be formed below the pad portion 103P of the lowermost gate electrode 103. According to other embodiments, at least three or more supporters may be formed below one contact plug 141. For example, a plurality of supporters may be formed regardless of the position where the contact plug 141 lands or is positioned on the end portions 103P.

The plug structure 140 may include a plurality of contact plugs 141. Each of the contact plugs 141 may be coupled to the pad portion 103P of each of the gate electrodes 103. The contact plugs 141 may have different heights, and their upper surfaces may be positioned at the same level. The contact plugs 141 may be coupled to the pad portion 103P by penetrating through an inter-layer dielectric layer 142.

The dielectric layers 102 and the supporters 131 and 132 may be formed of the same material. The dielectric layers 102 and the supporters 131 and 132 may include an oxide, such as silicon oxide.

The vertical channel structure 120 may be formed in the memory cell region MC. From the perspective of a top view, the vertical channel structures 120 may be regularly arrayed. The contact plug 141 may also be formed in the upper portion of the vertical channel structure 120.

The gate electrode 103 may be part of a word line, a control gate electrode, or a select gate electrode. The word line, the control gate electrode, and the select gate electrode may be part of a non-volatile memory device. The word line, the control gate electrode, and the select gate electrode may be part of a vertical NAND. The vertical memory device 100 may be a vertical NAND.

FIGS. 2A to 2M illustrate diverse application examples of a support structure.

Figure 2A:
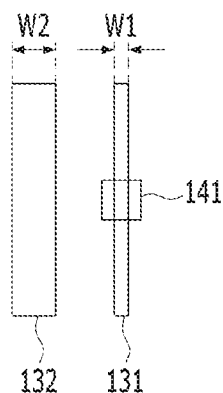
FIGS. 2A to 2M illustrate diverse application examples of a support structure.

Referring to FIG. 2A, the pair of supporters 131 and 132 may have different widths. The pair of supporters 131 and 132 may be parallel or substantially parallel to each other. The pair of supporters 131 and 132 may be in a line shape extending in one direction. The pair of supporters 131 and 132 may have the same length or substantially the same length. The first supporter 131 overlapping with the contact plug 141 may have a narrower width than the second supporter 132 (W1<W2). The second supporter 132 may have a wider width than the contact plug 141.

According to an embodiment, the width of the first supporter 131 may be wider than the width of the second supporter 132.

Figure 2B:
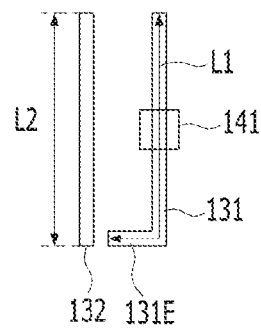
Figure 2C:
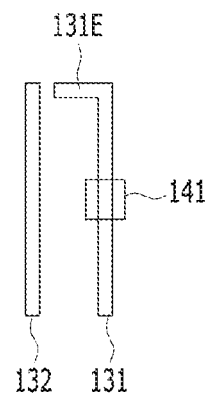
Figure 2D:
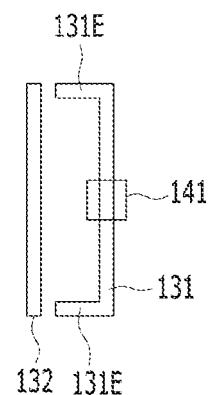

Referring to FIGS. 2B to 2D, the pair of supporters 131 and 132 may have different lengths. The first supporter 131 overlapping with the contact plug 141 may have a longer length than the second supporter 132 (L1>L2). The first supporter 131 may further include at least one extension portion 131E. As illustrated in FIGS. 2B and 2C, the extension portion 131E may extend from one end of the first supporter 131. As illustrated in FIG. 2D, an extension portion 131E may extend from both ends of the first supporter 131, respectively.

The extension portion 131E of the first supporter 131 may not be in contact with the second supporter 132.

As described above, since the extension portion 131E is further included, the supporting force of the first supporter 131 may be enhanced.

Figure 2E:
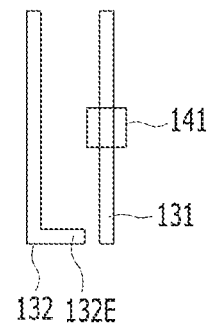
Figure 2F:
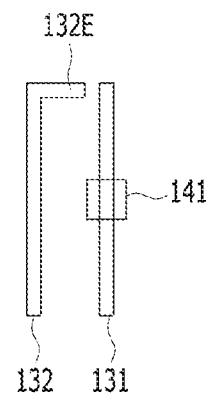
Figure 2G:
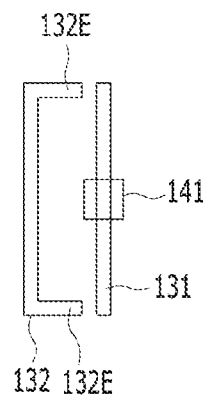

Referring to FIGS. 2E to 2G, the pair of supporters 131 and 132 may have different lengths. The first supporter 131 overlapping with the contact plug 141 may have a shorter length than the second supporter 132. The second supporter 132 may further include at least one extension portion 132E. As illustrated in FIGS. 2E and 2F, the extension portion 132E may extend from one end of the second supporter 132. As illustrated in FIG. 2G, an extension portion 132E may extend from both ends of the second supporter 132, respectively.

The extension portion 132E of the second supporter 132 might not be in contact with the first supporter 131.

As described above, as the extension portion 132E is further included, the supporting force of the second supporter 132 may be enhanced.

Figure 2H:
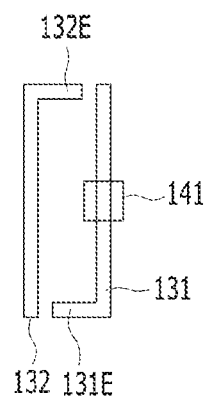
Figure 2I:
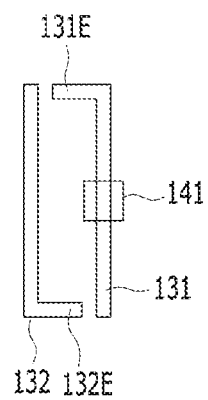

Referring to FIGS. 2H and 2I, the pair of supporters 131 and 132 may include one extension portion 131E and 132E, respectively. The extension portion 131E may extend from one end of the first supporter 131. The extension portion 132E may extend from one end of the second supporter 132.

As described above, since the extension portions 131E and 132E are further included, the supporting force of the first and second supporters 131 and 132 may be enhanced.

Figure 2J:
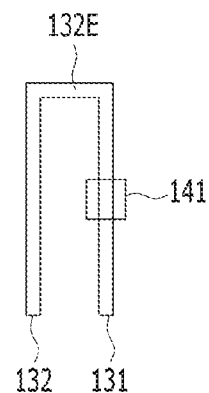
Figure 2K:
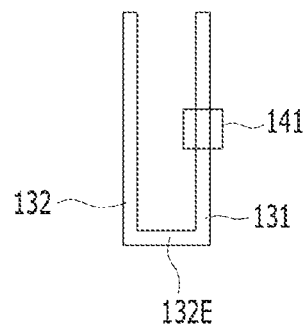

Referring to FIGS. 2J and 2K, the extension portion 132E of the second supporter 132 may be coupled to the first supporter 131.

Figure 2L:
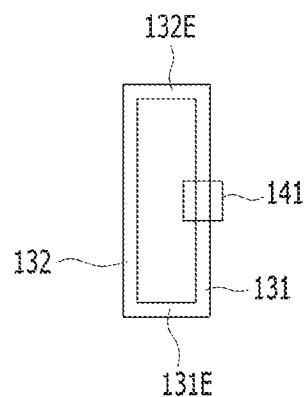

Referring to FIG. 2L, the extension portion 131E of the first supporter 131 may be coupled to the second supporter 132, and the extension portion 132E of the second supporter 132 may be coupled to the first supporter 131.

Figure 2M:
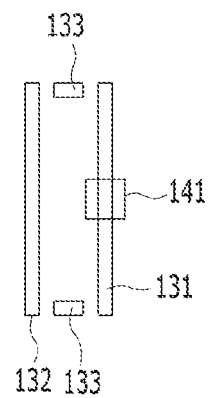

Referring to FIG. 2M, an additional supporter 133 may be further provided between the ends of the first supporter 131 and the ends of the second supporter 132. The additional supporter 133 might not contact the first and second supporters 131 and 132.

FIGS. 3A to 3G illustrate other application examples of a support structure.

Figure 3A:
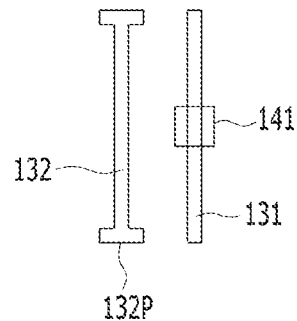
FIGS. 3A to 3G illustrate other application examples of a support structure.

Referring to FIG. 3A, the pair of supporters 131 and 132 may have different shapes. The pair of supporters 131 and 132 may be parallel or substantially parallel to each other. The pair of supporters 131 and 132 may be in the shape of a line extending in one direction. The second supporter 132 may have protrusions 132P at both ends. The first supporter 131 overlapping with the contact plug 141 might not have protrusions at both ends.

According to an embodiment, protrusions may also be formed at both ends of the first supporter 131.

Figure 3B:
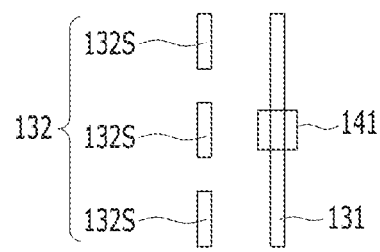
Figure 3C:
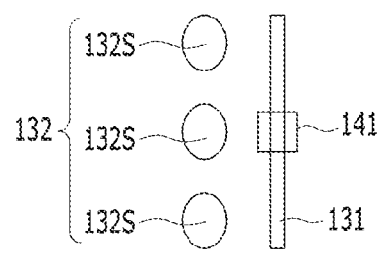
Figure 3D:
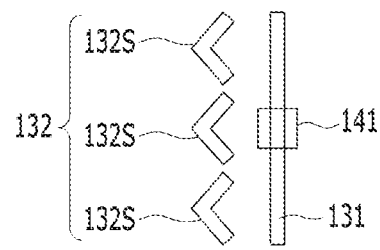

Referring to FIGS. 3B to 3D, the pair of supporters 131 and 132 may have different shapes. The pair of supporters 131 and 132 may be parallel or substantially parallel to each other. The first supporter 131 of the pair of supporters 131 and 132 may be in the form of a line shape extending in one direction. The second supporter 132 may include a plurality of isolated supporters 132S. The isolated supporters 132S may be spaced apart from one another. The shape of the isolated supporters 132S may be a rectangle, a circle, an ellipse or a polygon, etc., or a combination thereof. The shape of the isolated supporters 132S may include a closed curved shape, such as circular shape or a elliptical shape, etc.

Figure 3E:
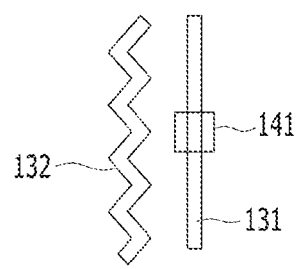

Referring to FIG. 3E, the second supporter 132 may have a wave shape, zigzag shape, or combination thereof. The first supporter 131 may have a line shape.

Figure 3F:
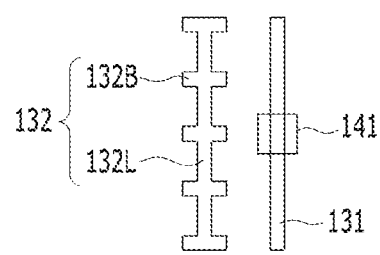
Figure 3G:
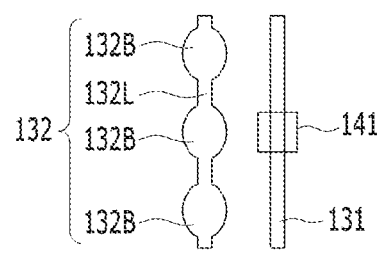

Referring to FIGS. 3F and 3G, the first supporter 131 may have a line shape. The second supporter 132 may include a line supporter 132L and a plurality of branch supporters 132B. The branch supporters 132B may have a shape penetrating through one line supporter 132L at regular intervals or substantially regular intervals. The shape of the line supporter 132L may be a rectangle, a circle, an ellipse or a polygon, etc., or a combination thereof. The shape of the line supporter 132L may include a closed curved shape, such as circular shape or an elliptical shape, etc. The shape of the branch supporter 132B may be a rectangle, a circle, an ellipse or a polygon, etc., or a combination thereof. The shape of the branch supporter 132B may include a closed curved shape, such as circular shape or an elliptical shape, etc.

As illustrated in FIGS. 1A to 3G, the stacked structure 110 may be protected from being bent by forming the supporters 131 and 132. By forming the plurality of supporters 131 and 132 below the contact plug 141, a punch-through of the contact plugs 141 may be prevented. Since the supporters 131 and 132 may be formed regardless of the landing position of the contact plug 141, the number of the supporters 131 and 132 may be increased. As a result, the stacked structure 110 may be further protected from being bent, contorted, deformed, warped, etc.

Therefore, the integration degree of the vertical memory device 100 may be improved with still providing a highly reliable memory device.

FIGS. 4A to 4K are cross-sectional views illustrating a method for fabricating a vertical memory device in accordance with an embodiment.

Figure 4A:
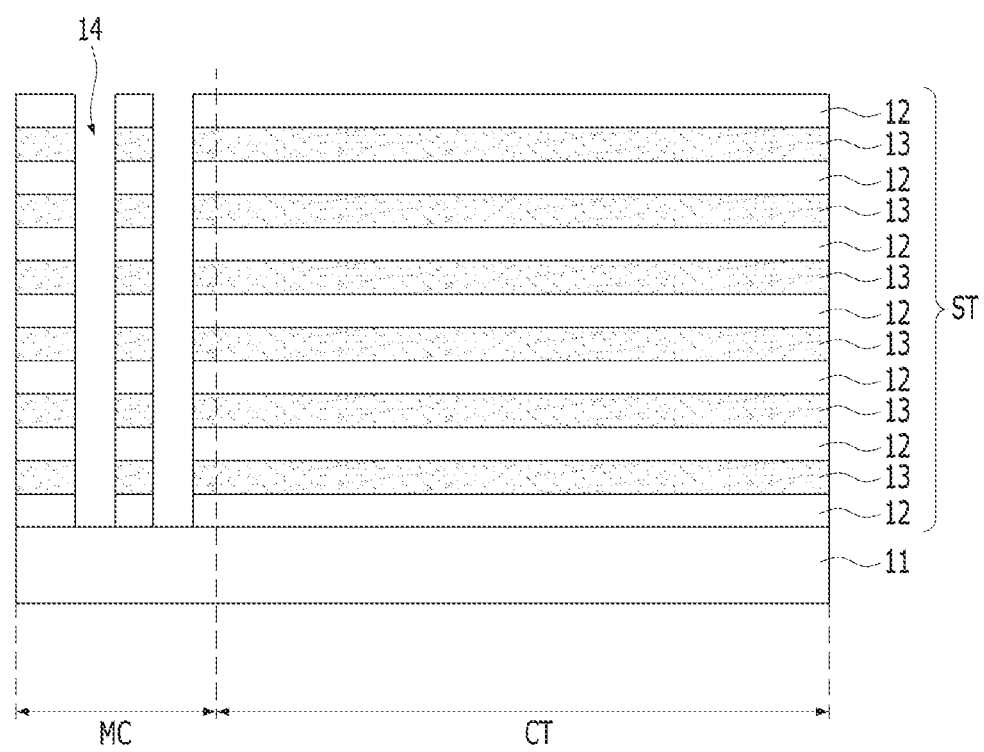

Referring to FIG. 4A, a substrate 11 including a memory cell region MC and a contact region CT may be prepared. The substrate 11 may include a semiconductor material. The substrate 11 may include a semiconductor substrate. The substrate 11 may be formed of a silicon-containing material. The substrate 11 may include silicon, monocrystalline silicon, polysilicon, amorphous silicon, silicon germanium, monocrystalline silicon germanium, polycrystalline silicon germanium, carbon doped silicon, a combination thereof, or a multilayer thereof. The substrate 11 may include other semiconductor materials, such as germanium. The substrate 11 may include a III/V-group semiconductor substrate, for example, a compound semiconductor substrate, such as GaAs. The substrate 11 may include an SOI (Silicon-On-Insulator) substrate. The substrate 11 may have a stacked structure including a semiconductor substrate, transistors formed over the semiconductor substrate, and multi-layer metal lines.

An alternating stack ST may be formed over the substrate 11. The alternating stack ST may be formed by alternately stacking a plurality of dielectric layers 12 and a plurality of sacrificial layers 13. The dielectric layer 12 may include a silicon oxide. The sacrificial layer 13 may include a material having an etch selectivity with respect to the dielectric layer 12. The sacrificial layer 13 may include a material having a wet etching property different from that of the dielectric layer 12. The sacrificial layer 13 may include silicon nitride, silicon oxynitride, polysilicon or silicon germanium. The uppermost layer of the alternating stack ST may be a dielectric layer 12.

Subsequently, a plurality of channel holes 14 may be formed in the alternating stack ST. The channel holes 14 may penetrate through the alternating stack ST of the memory cell region MC.

Referring to FIG. 4B, a vertical channel structure 15 may be formed in each of the channel holes 14. A plurality of vertical channel structures 15 may be formed in the memory cell region MC. Each of the vertical channel structures 15 may include a blocking layer 15A, a charge storage layer 15B, a tunnel dielectric layer 15C, a channel layer 15D, and a core dielectric layer 15E. The blocking layer 15A may be formed of an oxide, and the charge storage layer 15B may be formed of a nitride. The tunnel dielectric layer 15C may be formed of an oxide.

The channel layer 15D may include a semiconductor material. For example, the channel layer 15D may include one among a polycrystalline semiconductor material, an amorphous semiconductor material, or a monocrystalline semiconductor material. The channel layer 15D may include silicon (Si), germanium (Ge), silicon germanium (SiGe), a III-V-group compound, or a II-VI-group compound. The channel layer 15D may include polysilicon.

The channel layer 15D, the tunnel dielectric layer 15C, the charge storage layer 15B, and the blocking layer 15A may be formed in a spacer shape on the sidewall of the channel hole 14. According to an embodiment, the channel layer 15D, the tunnel dielectric layer 15C, the charge storage layer 15B, and the blocking layer 15A may have a shape opened at the top and the bottom.

According to an embodiment, the channel layer 15D may be a tube shape having an inner space. According to an embodiment, the channel layer 15D may have a shape opened at the top and the bottom.

The inner space of the channel layer 15D may be fully filled with the core dielectric layer 15E. The core dielectric layer 15E may include a silicon oxide or a silicon nitride. The vertical channel structure 15 may further include a conductive pad 15F. A conductive pad 15F may be formed over the core dielectric layer 15E. After recessing a portion of the core dielectric layer 15E, a conductive pad 15F may be formed. The inner space of the channel layer 15D may be filled with the core dielectric layer 15E and the conductive pad 15F. The conductive pad 15F may include polysilicon doped with an impurity. The conductive pad 15F may be electrically connected to the channel layer 15D.

The vertical channel structure 15 may be referred to as 'a pillar structure.'

According to an embodiment, the channel layer 15D may be embedded in the inside of the channel hole 14 to fill the central region of the channel hole 14. Herein, the core dielectric layer 15E may be omitted, and the conductive pad 15F may be formed by doping the top of the channel layer 15D with an impurity.

Figure 4C:
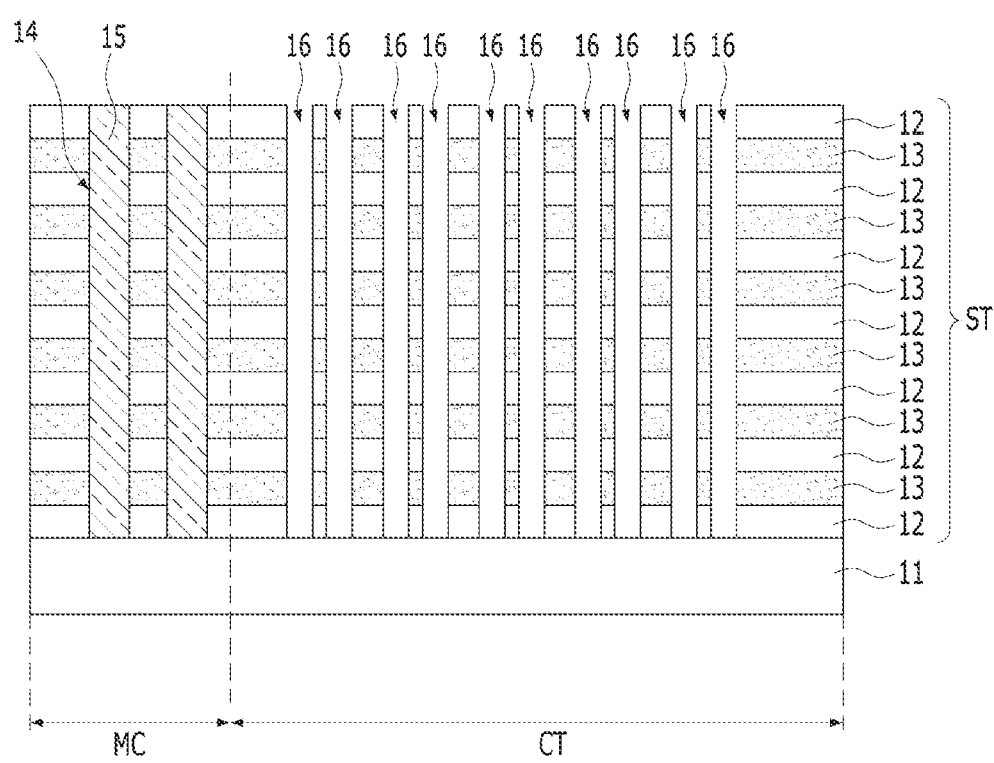

Referring to FIG. 4C, a plurality of openings 16 may be formed in the alternating stack ST of the contact region CT. For example, a plurality of openings 16 may be formed by etching the alternating stack ST. A plurality of openings 16 may expose some surfaces of the substrate 11. In order to form the openings 16, the alternating stack ST may be etched by using a mask layer (not shown). The openings 16 may be formed simultaneously when the first slit SL1 of FIG. 1A is formed.

The openings 16 may have a vertical shape extending perpendicularly to the surface of the substrate 11. This may be referred to as 'vertical opening'. From the perspective of a top view, the opening 16 may be rectangular. According to an embodiment, the opening 16 may be a circle, a rectangle, an ellipse, or a polygon, etc., or a combination thereof. The shape of the opening 16 may include a closed curved shape, such as circular shape or a elliptical shape, etc. The opening 16 may be formed in the same shape as the first and second supporters 131 and 132 shown in FIGS. 2A to 3G.

Figure 4D:
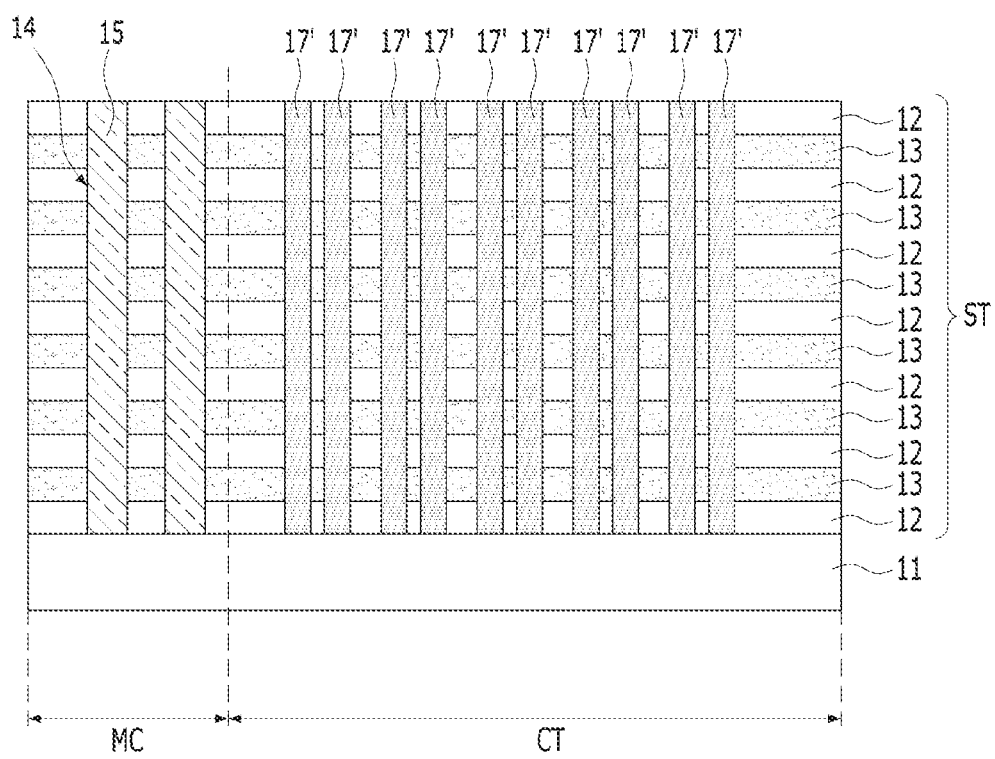

Referring to FIG. 4D, a preliminary supporter 17' may be formed in the openings 16. The preliminary supporter 17' may fill each of the plurality of openings 16. In order to form the preliminary supporter 17', formation of a support material and planarization may be performed sequentially. For example, after forming a support material over the alternating stack ST to fill the openings 16, the support material may be planarized to expose the top surface of the alternating stack ST. The preliminary supporter 17' may be formed of a support material, and the support material may include a material having an etch selectivity with respect to the sacrificial layer 13. The support material may include a silicon oxide. The support material and the dielectric layer 12 may be of the same material. The preliminary supporter 17' may have a vertical shape that fills the openings 16.

The preliminary supporters 17' may have the same height or substantially the same height. The bottom surface of the preliminary supporters 17' may contact the substrate 11. The top surfaces of the preliminary supporters 17' may be positioned at the same level or substantially a same level.

Figure 4E:
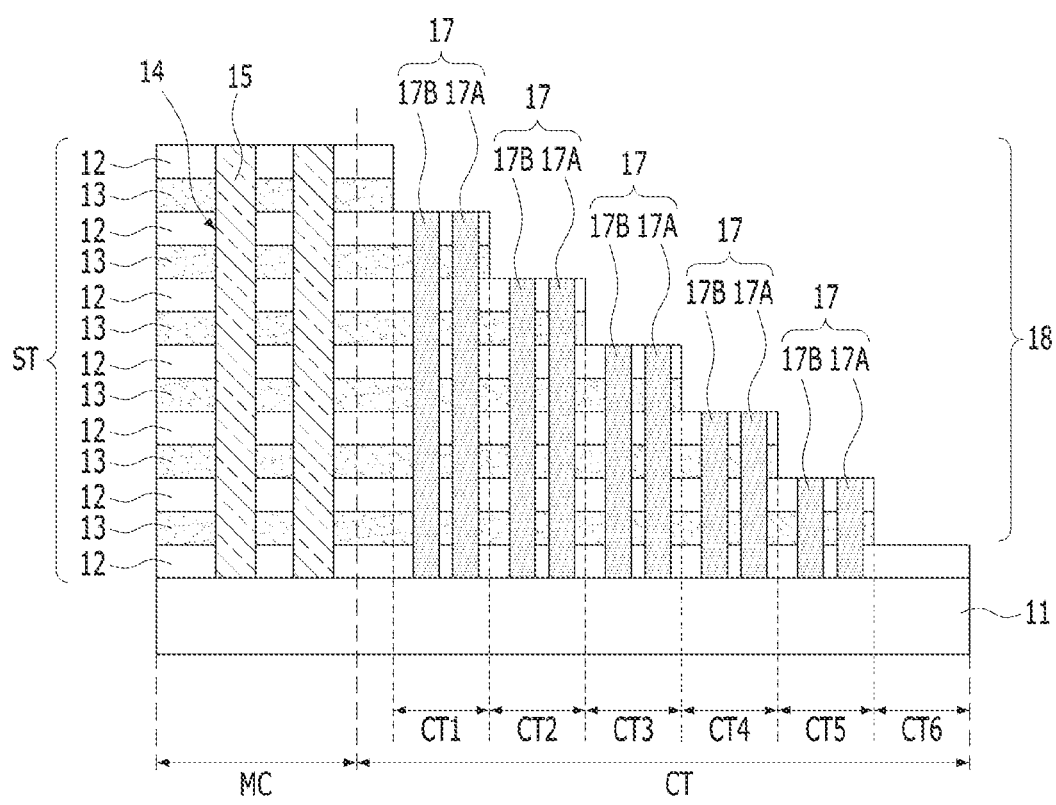

Referring to FIG. 4E, a slimming process may be performed. The step structure 18 may be formed in the contact region CT by the slimming process. The slimming process may etch the dielectric layers 12 and the sacrificial layers 13 in the form of steps in the contact region CT. The height of the stacked dielectric layers 12 and the sacrificial layers 13 in the contact region CT may be gradually reduced toward the edge.

When the dielectric layers 12 and the sacrificial layers 13 are etched in the form of steps in the contact region CT, the preliminary supporters 17' may also be etched together. As a result, a plurality of supporters 17 may be formed. The supporters 17 may be sequentially reduced in height along the step structure 18 toward the edge of the contact region CT.

The dielectric layers 12 and the sacrificial layer 13 may have a shape of consecutive steps in the contact region CT. As a result, the horizontal lengths of the dielectric layers 12 may be different from each other, and the horizontal lengths of the sacrificial layers 13 may be different from each other. The horizontal length of each of the dielectric layers 12 may become shorter as it goes vertically from the substrate 11 toward the upper portion. For example, the horizontal length of the lowermost dielectric layer 12 may be the longest, and the horizontal length of the uppermost dielectric layer 12 may be the shortest. The horizontal length of each of the sacrificial layers 13 may be substantially equal to the horizontal length of the dielectric layer 12 positioned over the sacrificial layers 13.

The contact region CT may include a plurality of contact regions CT1 to CT6. The number of the contact regions CT1 to CT6 may be equal to the number of the sacrificial layers 13. One of the contact regions CT1 to CT6 may include a pair of supporters 17A and 17B, and the pair of supporters 17A and 17B may have the same height or substantially the same height. A subsequent contact plug may land on one supporter 17A of the pair of supporters 17A and 17B. The subsequent contact plug might not land on the other supporter 17B of the pair of supporters 17A and 17B.

The step structure 18 may be referred to as 'a supporter-embedded step structure' in which the supporters 17 are embedded.

Figure 4F:
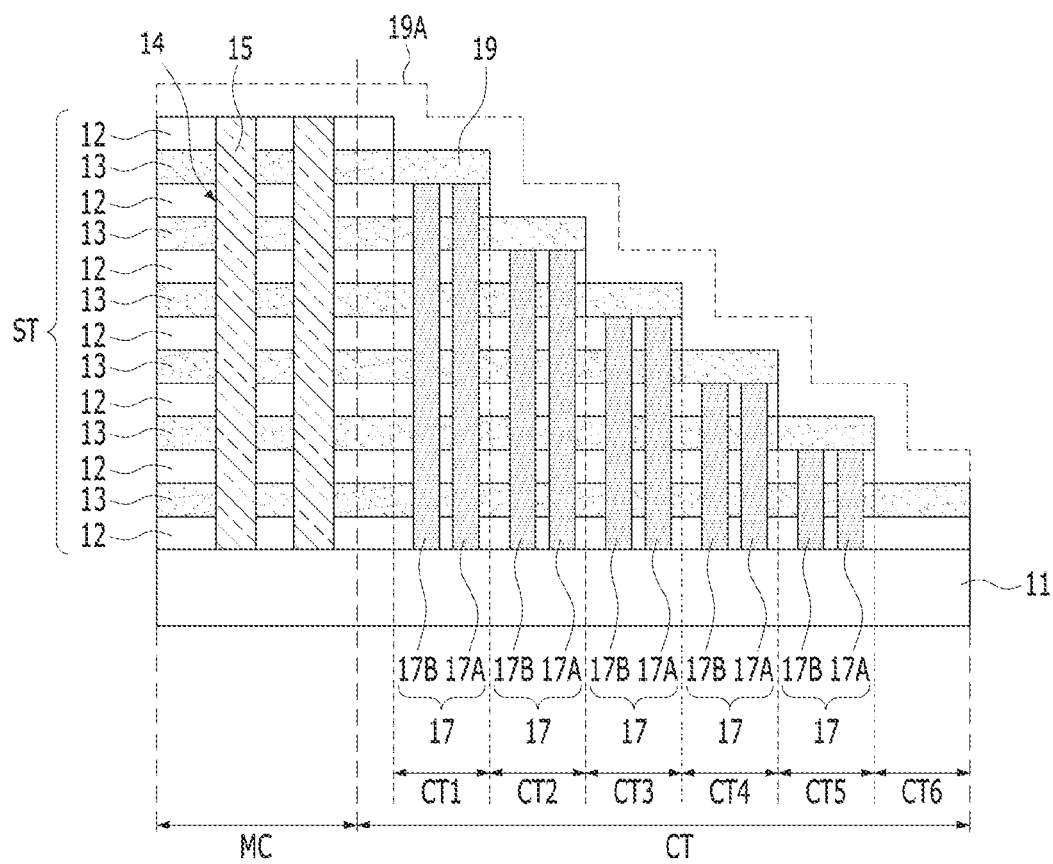

Referring to FIG. 4F, a plurality of sacrificial pads 19 may be formed. The sacrificial pads 19 may be coupled to the ends of sacrificial layers 13. The sacrificial pads 19 may be positioned in the contact regions CT1 to CT6, respectively. Therefore, the pair of supporters 17A and 17B may be covered with one sacrificial pad 19. The sacrificial pads 19 and the sacrificial layers 13 may be of the same thickness. The sacrificial pads 19 and the sacrificial layers 13 may be of the same material. The sacrificial pads 19 may include a material having an etch selectivity with respect to the dielectric layer 12. The sacrificial pads 19 may include a silicon nitride.

The sacrificial pads 19 may be formed by forming a sacrificial material 19A over the profile of the substrate 11 including the contact region CT by selectively etching the sacrificial material 19A. The sacrificial material 19A may be selectively etched through an etch-back process. According to an embodiment, the thickness of the sacrificial pads 19 may be thicker than the thickness of the sacrificial layers 13.

Figure 4G:
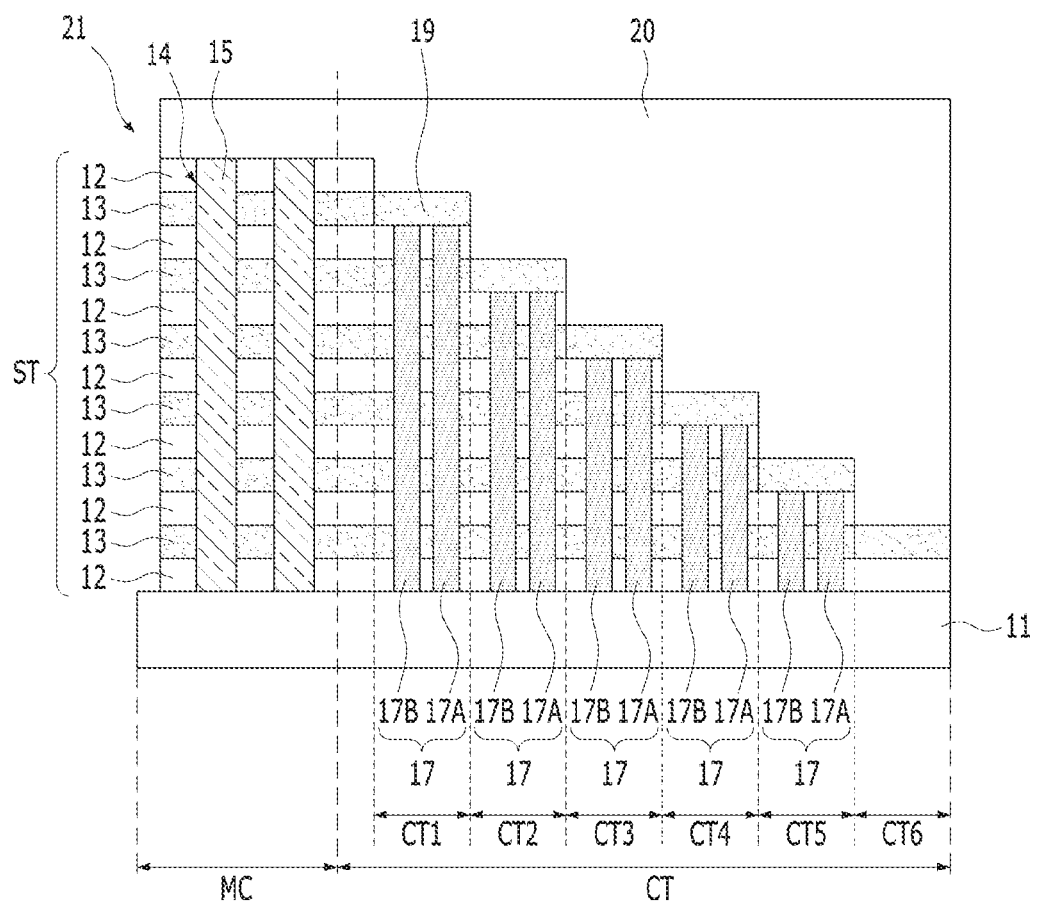

Referring to FIG. 4G, an inter-layer dielectric layer 20 may be formed. The inter-layer dielectric layer 20 may be formed over the profile of the substrate 11 including the contact region CT. The inter-layer dielectric layer 20 may include a silicon oxide.

Subsequently, the slit 21 may be formed. The slit 21 may correspond to the second slit SL2 shown in FIG. 1A. The inter-layer dielectric layer 20 and the alternating stack ST of the memory cell region MC may be etched to form the slit 21. The slit 21 may have a form of a trench. The slit 21 may expose the surface of the substrate 11.

Figure 4H:
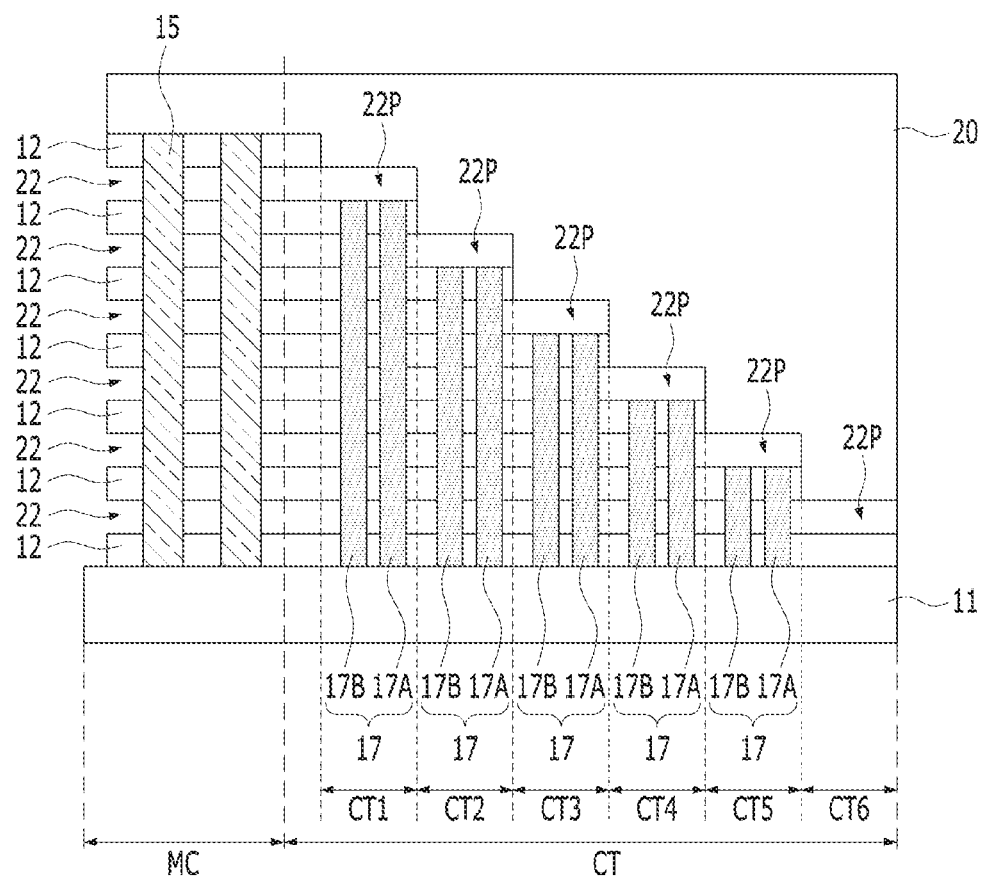

Referring to FIG. 4H, the sacrificial layers 13 may be removed through the slit 21. Accordingly, the recesses 22 may be formed between the dielectric layers 12. The sacrificial layers 13 may be removed by a wet-etch process. For example, when the sacrificial layers 13 include a silicon nitride, the sacrificial layers 13 may be removed by a wet-etch process using a phosphoric acid ($H_3PO_4$) solution. The recesses 22 may be parallel to the surface of the substrate 11. The recesses 22 may be referred to as horizontal recesses. The recesses 22 may expose the sidewalls of the vertical channel structure 15. The recesses 22 may be parallel to the surface of the substrate 11.

A plurality of preliminary pad portions 22P, which are the ends of the recesses 22, may be positioned in the contact region CT. For example, all of the sacrificial pads 19 may be removed while the sacrificial layers 13 are removed, and thus the preliminary pad portions 22P may be formed.

Figure 4I:
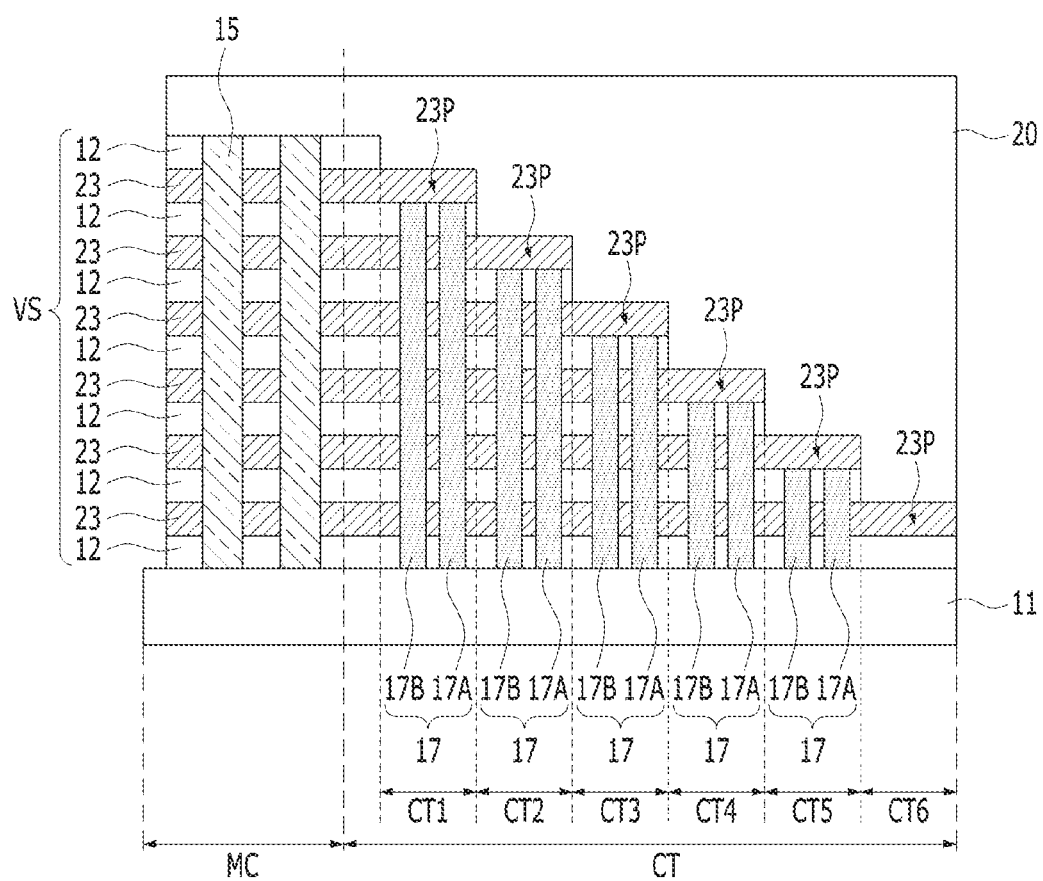

Referring to FIG. 4I, a plurality of gate electrodes 23 may be formed. In order to form the gate electrodes 23, the recesses 22 may be filled with a conductive material. The gate electrodes 23 may have a shape of surrounding the vertical channel structure 15.

The gate electrodes 23 may include a low-resistance material. The gate electrodes 23 may include a metal-based material. The gate electrodes 23 may include a metal, a metal silicide, a metal nitride, or a combination thereof. For example, the metal may include nickel, cobalt, platinum, titanium, tantalum or tungsten, etc. The metal silicide may include a nickel silicide, a cobalt silicide, a platinum silicide, a titanium silicide, a tantalum silicide or a tungsten silicide, etc. The gate electrodes 23 may include a tungsten layer. The tungsten layer may be deposited by using $WF_6$ as a tungsten source material and using at least one among $H_2$, $SiH_4$, and $B_2H_6$ as a reducing gas. According to an embodiment, the tungsten layer may be deposited by using a fluorine-free tungsten source, such as $W(CO)_6$. According to an embodiment, the gate electrodes 23 may be of a titanium nitride/tungsten (TiN/W) stack, and the titanium nitride may serve as a barrier. After conformally depositing a thin titanium nitride over the recesses 22, the recesses 22 may be filled with a tungsten layer.

The gate electrodes 23 may be vertically stacked with the dielectric layers 12 interposed therebetween. A stacked structure VS where a plurality of dielectric layers 12 and a plurality of gate electrodes 23 are alternately stacked may be formed.

The ends of the gate electrodes 23 may be defined as a pad portion 23P. For example, the ends of the gate electrode 23 may be formed by filling the preliminary pad portions 22P with a conductive material, which may be referred to as the pad portion 23P. Therefore, the pad portions 23P may be defined in the contact region CT. A pair of supporters 17A and 17B may be positioned below each of the pad portions 23P. A pair of supporters 17A and 17B may correspond to one pad portion 23P. The supporters 17A and 17B may have a shape of penetrating through the gate electrodes 23 and the dielectric layers 12 except the uppermost dielectric layer 12 and the uppermost dielectric layers 12. The supporters 17A and 17B might not be formed below the lowermost gate electrode 23.

Figure 4J:
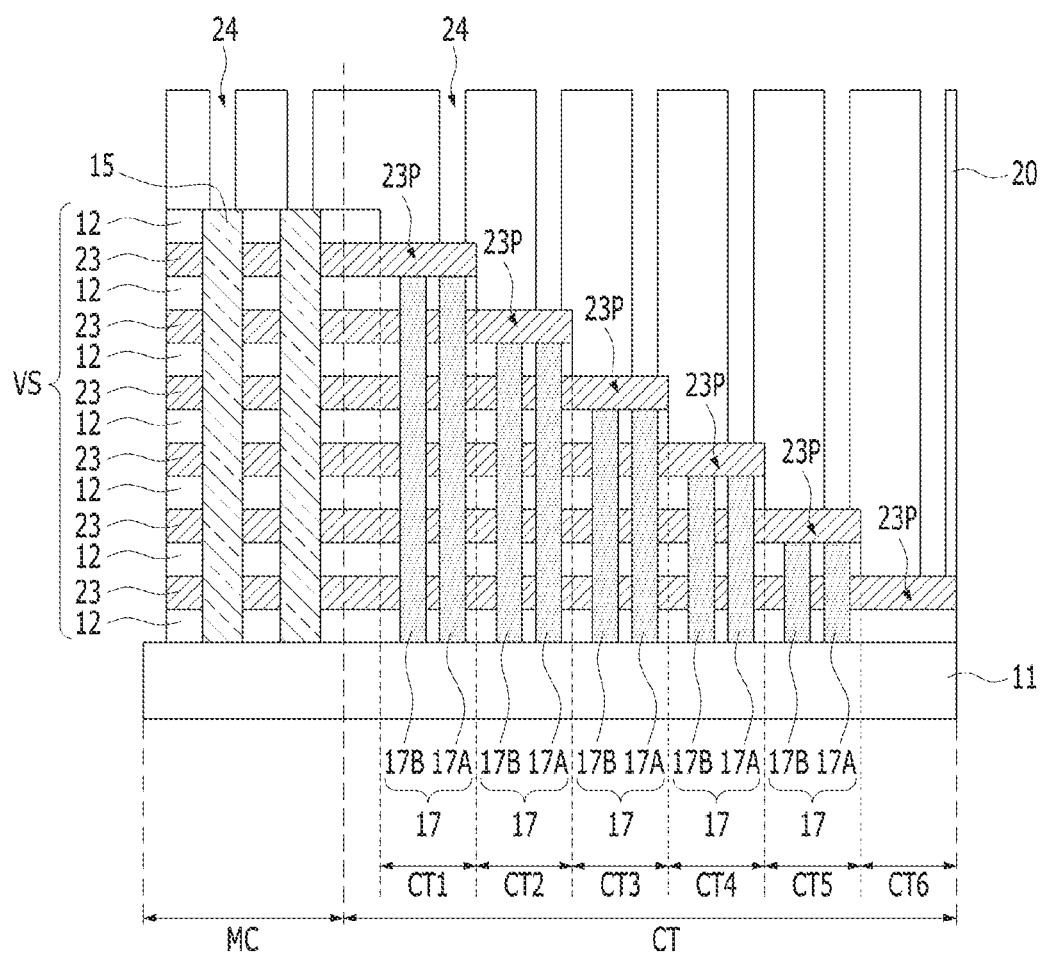

Referring to FIG. 4J, a plurality of contact holes 24 may be formed. A plurality of contact holes 24 may be formed in each of the contact regions CT1 to CT6. The contact holes 24 may be formed to penetrate through the inter-layer dielectric layer 20 in each of the contact regions CT1 to CT6. The contact hole 24 may be formed by forming a mask (not shown) over the inter-layer dielectric layer 20 and etching the inter-layer dielectric layer 20 by using the mask as an etching mask. The contact hole 24 may land on the surface of the pad portion 23P formed in each of the contact regions CT1 to CT6. The contact hole 24 might not penetrate through the pad portion 23P, so that the pair of supporters 17A and 17B might not be exposed.

A contact hole 24 may be formed to expose the upper portion of the vertical channel structure 15 in the memory cell region MC while forming the contact hole 24 in the contact region CT. The width of the contact hole 24 may be wider than the width of the supporter 17A. Meanwhile, even though the upper pad portion 23P is etched when the contact hole 24 is formed, the lower supporter 17A may protect the lower gate electrode 23 from being penetrated.

Figure 4K:
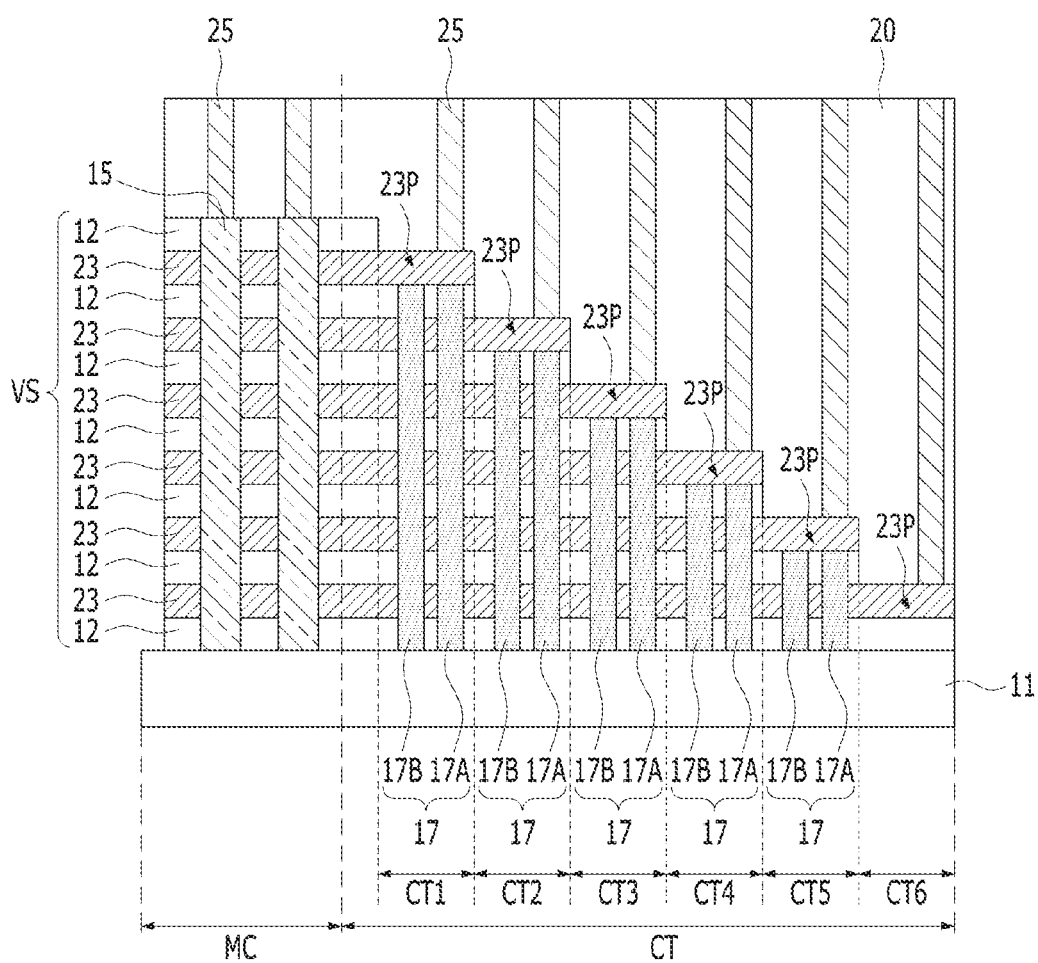

Referring to FIG. 4K, a plurality of contact plugs 25 may be formed. In order to form a plurality of contact plugs 25, the plurality of contact holes 24 may be filled with a conductive material such as a metal layer and then planarized. The contact plugs 25 may have different heights. The contact plug 25 may also be formed in the memory cell region MC as well.

According to the embodiments, a bending of memory cell stack may be prevented by forming a plurality of supporters in a contact region.

According to the embodiments, the punch through of the contact plug may be prevented by forming a plurality of supporters under the contact plug.

Therefore, it may be possible to improve the degree of integration for a vertical memory device while maintaining a highly reliable memory device and way of manufacturing the memory device.

While examples been described with respect to the specific embodiments, it will be apparent to those skilled in the art that various changes and modifications may be made without departing from the spirit and scope of the disclosure as defined in the following claims.

What is claimed is:

1. A vertical memory device, comprising:
   a substrate including a memory cell region and a contact region;
   a plurality of gate electrodes that extend from the memory cell region to the contact region and include pad portions which are end portions stacked in a step shape in the contact region;
   a plurality of contact plugs coupled to the pad portions of the gate electrodes; and
   a plurality of supporters coupled between the pad portions of the gate electrodes and the substrate, respectively,
   wherein respective ones of the supporters including a first supporter that directly contacts a bottom surface of the pad portions of the gate electrodes and vertically overlaps with the contact plugs.

2. The vertical memory device of claim 1, wherein the supporters comprise a dielectric material.

3. The vertical memory device of claim 1, wherein respective ones of the supporters further comprise a second supporter that directly contacts the bottom surface of the pad portions of the gate electrodes and are spaced apart from the first supporter.

4. The vertical memory device of claim 3, wherein the first supporter and the second supporter have line shape, and the first supporter and the second supporter are parallel to each other.

5. The vertical memory device of claim 1, wherein each of the supporters extend substantially perpendicular from a surface of the substrate to couple with a gate electrode from the plurality of gate electrodes.

6. The vertical memory device of claim 1, wherein upper surfaces of the supporters coupled between a surface of the substrate and a gate electrode from the plurality of gate electrodes have different heights from the surface of the substrate.

7. The vertical memory device of claim 1, wherein a bottom surface of each of the supporters contacts a surface of the substrate.

8. The vertical memory device of claim 1, wherein a cross-sectional area of each of the supporters coupled to a pad portion from the plurality of pad portions is greater than a cross-sectional area of a contact plug, from the plurality of contact plugs, coupled to the pad portion.

9. The vertical memory device of claim 1, further comprising:
   a plurality of dielectric layers formed between the gate electrodes.

10. The vertical memory device of claim 9, wherein the dielectric layers and the supporters are formed of substantially the same material.

11. The vertical memory device of claim 1, further comprising:
    a plurality of vertical channel structures penetrating through the gate electrodes that are stacked in the memory cell region.

12. The vertical memory device of claim 1, wherein a cross-section of each of the supporters has substantially a circular, an elliptical, or polygonal shape.

13. The vertical memory device of claim 1, wherein the first supporter comprising:
    a line portion vertically overlaps with the contact plugs; and
    at least one bended extension portion extend from one end of the line portion.

14. A vertical memory device, comprising:
    a substrate including a first region and a second region;
    a plurality of horizontal dielectric layers and a plurality of horizontal conductive layers that extend from the first region to the second region and have end portions stacked in a step shape in the second region;
    a plurality of vertical conductive layers that are coupled to the end portions of the horizontal conductive layers; and
    at least a pair of dielectric supporters that are formed below each of the end portions of the horizontal conductive layers and penetrate through the horizontal dielectric layers,
    wherein respective ones of the pair of the dielectric supporters including a first supporter that directly contacts a bottom surface of the end portions of the horizontal conductive layers and vertically overlaps with the vertical conductive layers.

15. The vertical memory device of claim 14, wherein each of the pairs of supporters further comprising a second supporter that is spaced apart from the first supporter and does not vertically overlap with the vertical conductive layer.

16. The vertical memory device of claim 14, wherein each of the pairs of supporters extend substantially perpendicular from a surface of the substrate.

17. The vertical memory device of claim 14, wherein the horizontal conductive layers and the vertical conductive layers include a metallic material.

18. The vertical memory device of claim 14, wherein the horizontal dielectric layers and the supporters include an oxide.

19. The vertical memory device of claim 14, further comprising:
   a plurality of conductive vertical structures that penetrate through the horizontal conductive layers and the horizontal dielectric layers in the first region.

20. The vertical memory device of claim 14, wherein the first region is a memory cell region and the second region is a contact region.

* * * * *